(12) United States Patent
Yun et al.

(10) Patent No.: US 10,360,156 B2
(45) Date of Patent: Jul. 23, 2019

(54) DATA STORAGE DEVICE USING HOST MEMORY AND METHOD OF OPERATING SAME

(71) Applicant: SAMSUNG ELECTRONICS CO., LTD., Suwon-si, Gyeonggi-Do (KR)

(72) Inventors: Eun-Jin Yun, Seoul (KR); Sil Wan Chang, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 59 days.

(21) Appl. No.: 15/652,259

(22) Filed: Jul. 18, 2017

(65) Prior Publication Data

US 2018/0039578 A1 Feb. 8, 2018

(30) Foreign Application Priority Data

Aug. 4, 2016 (KR) .................. 10-2016-0099599

(51) Int. Cl.
*G06F 11/10* (2006.01)
*G06F 12/1009* (2016.01)
(Continued)

(52) U.S. Cl.
CPC .......... *G06F 12/1009* (2013.01); *G06F 3/065* (2013.01); *G06F 3/0619* (2013.01);
(Continued)

(58) Field of Classification Search
CPC .. G06F 12/1009; G06F 3/0619; G06F 3/0631; G06F 3/065; G06F 3/0653;
(Continued)

(56) References Cited

U.S. PATENT DOCUMENTS 5,357,623 A * 10/1994 Megory-Cohen ........................ G06F 12/0842 711/129
8,745,312 B2  6/2014 Yun et al.
(Continued)

OTHER PUBLICATIONS

Jeroen Dorgelo et al., "Host Memory Buffer (HMB) based SSD System;" Marvell Technology Group Ltd, Aug. 13, 2015, Forum J-31: PCIe/NVMe Storage, pp. 1-16.
(Continued)

*Primary Examiner* — John J Tabone, Jr.
(74) *Attorney, Agent, or Firm* — Volentine, Whitt & Francos, PLLC

(57) ABSTRACT

A method of operating a data storage device in which a nonvolatile memory is included and a mapping table defining a mapping relation between a physical address and a logical address of the nonvolatile memory is stored in a host memory buffer of a host memory includes requesting a host for an asynchronous event based on information about a map miss that the mapping relation about the logical address received from the host is not included in the mapping table, receiving information about the host memory buffer adjusted by the host based on the asynchronous event, and updating the mapping table to the adjusted host memory buffer with reference to the information about the host memory buffer. A method of operating a data storage device according to example embodiments of the inventive concept can reduce the number of map misses or improve reliability of a nonvolatile memory.

19 Claims, 11 Drawing Sheets

(51) Int. Cl.
*G06F 3/06* (2006.01)
*G11C 29/52* (2006.01)
*G06F 12/02* (2006.01)
*G11C 29/04* (2006.01)

(52) U.S. Cl.
CPC .......... *G06F 3/0631* (2013.01); *G06F 3/0653* (2013.01); *G06F 3/0656* (2013.01); *G06F 3/0659* (2013.01); *G06F 3/0688* (2013.01); *G06F 11/1048* (2013.01); *G06F 11/1068* (2013.01); *G06F 12/0246* (2013.01); *G11C 29/52* (2013.01); *G06F 2212/1024* (2013.01); *G06F 2212/65* (2013.01); *G06F 2212/7201* (2013.01); *G11C 2029/0409* (2013.01)

(58) Field of Classification Search
CPC .... G06F 3/0656; G06F 3/0659; G06F 3/0688; G06F 11/1048; G06F 11/1068; G06F 12/0246; G06F 2212/1024; G06F 2212/65; G06F 2212/7201; G11C 29/52; G11C 2029/0409
USPC ........ 714/764, 763, 768, 769, 773; 711/100, 711/103–105, 113, 129, 154, 170, 171
See application file for complete search history.

(56) References Cited

U.S. PATENT DOCUMENTS

| | | | | |
|---|---|---|---|---|
| 9,043,536 B2* | 5/2015 | Ho | ...................... | G06F 12/0246 711/103 |
| 9,218,257 B2 | 12/2015 | Kazemi et al. | | |
| 9,323,659 B2 | 4/2016 | Shats et al. | | |
| 9,639,475 B2* | 5/2017 | Tan | ...................... | G06F 12/0246 |
| 9,772,797 B2* | 9/2017 | Tan | ...................... | G06F 12/0246 |
| 2009/0113121 A1* | 4/2009 | Lee | ...................... | G06F 12/0246 711/103 |
| 2009/0210620 A1 | 8/2009 | Jibbe et al. | | |
| 2010/0077136 A1* | 3/2010 | Ware | .................... | G06F 12/0246 711/103 |
| 2010/0332786 A1* | 12/2010 | Grohoski | .............. | G06F 9/3851 711/207 |
| 2013/0282957 A1* | 10/2013 | Mylly | ................. | G06F 12/0223 711/103 |
| 2014/0143496 A1 | 5/2014 | Bert | | |
| 2014/0289451 A1* | 9/2014 | Ho | ...................... | G06F 12/0246 711/103 |
| 2014/0365719 A1 | 12/2014 | Kuzmin et al. | | |
| 2015/0046654 A1 | 2/2015 | Soundararajan et al. | | |
| 2015/0067262 A1* | 3/2015 | Uttamchandani | ... | G06F 12/0848 711/129 |
| 2015/0199269 A1 | 7/2015 | Bert et al. | | |
| 2016/0026406 A1* | 1/2016 | Hahn | .................... | G06F 3/0631 711/103 |
| 2016/0034217 A1* | 2/2016 | Kim | ...................... | G06F 3/0622 711/103 |
| 2016/0110251 A1 | 4/2016 | Kazemi et al. | | |
| 2016/0117241 A1 | 4/2016 | Shah et al. | | |
| 2016/0267016 A1* | 9/2016 | Lee | ........................... | G06F 3/06 |
| 2016/0313927 A1* | 10/2016 | Lin | .......................... | G06F 3/0611 |
| 2017/0083451 A1* | 3/2017 | Tan | ...................... | G06F 12/0246 |
| 2017/0139642 A1* | 5/2017 | Tan | ...................... | G06F 12/0246 |
| 2017/0315925 A1* | 11/2017 | Yeh | ...................... | G06F 12/1009 |
| 2017/0351452 A1* | 12/2017 | Boyd | .................... | G06F 3/0611 |
| 2018/0052634 A1* | 2/2018 | Ngu | ...................... | G06F 3/0611 |
| 2018/0089076 A1* | 3/2018 | Li | .......................... | G06F 3/0679 |

OTHER PUBLICATIONS

Tom Lenny, "NVM Express™: Unlock the Potential," Flash Memory Summit, 2014 Santa Clara, CA, pp. 1-91.
NVM Express, 2014 NVM Express, Inc., Nov. 3, 2014, pp. 1-205.

* cited by examiner

FIG. 14

Asynchronous event request - Completion queue(CQ)

| Bit | Description |
|---|---|
| 02:00 | Asynchronous event type |

Asynchronous event information

| Value | Description |
|---|---|
| 3h | Map miss threshold - A number of map miss is larger than map miss threshold |
| 4h | Reliability threshold - Need of defense code for reliability-index improvement |

FIG. 15

Set feature - Feature identifiers

| Feature identifiers | Description |
|---|---|
| 0Eh | Threshold information (Ex. Miss threshold, Reliability threshold) |

Threshold information

| Bit | Description |
|---|---|
| 21:20 | Threshold type - Map miss threshold or reliability threshold |
| 19:16 | Threshold setting - Threshold is modified by a set feature or threshold is returned by get feature |
| 15:00 | Threshold value |

# DATA STORAGE DEVICE USING HOST MEMORY AND METHOD OF OPERATING SAME

CROSS-REFERENCE TO RELATED APPLICATIONS

This U.S. non-provisional patent application claims priority under 35 U.S.C. § 119 to Korean Patent Application No. 10-2016-0099599, filed on Aug. 4, 2016, the subject matter of which is hereby incorporated by reference.

BACKGROUND

The inventive concept relates to data storage devices, and more particularly, to a data storage device using a host memory and a method of operating same.

A host may use a data storage device including nonvolatile memory, such as flash memory. Flash memory uses a flash translation layer (FTL) to map logical addresses generated by the host and corresponding physical addresses used by the data storage device. One or more mapping table(s) associated with the FTL may be stored in the data storage device.

The data storage device may include a separate volatile memory (e.g., dynamic random access memory (DRAM) or static RAM (SRAM)) that may be used to rapidly access the mapping table(s). However, when power supplied to the data storage device is interrupted, the mapping table(s) stored in the volatile memory may be lost. Further, as the size of mapping table(s) increases, a large quantity of volatile memory will also increase, thereby driving up the cost and physical size of the data storage device.

SUMMARY

Example embodiments of the inventive concept provide a method of operating a data storage device in which a nonvolatile memory is included and a mapping table defining a mapping relation between a physical address and a logical address of the nonvolatile memory is stored in a host memory buffer of a host memory. The method may include requesting a host for an asynchronous event based on information about a map miss that the mapping relation about the logical address received from the host is not included in the mapping table, receiving information about the host memory buffer adjusted by the host based on the asynchronous event, and updating the mapping table to the adjusted host memory buffer with reference to the information about the host memory buffer.

Example embodiments of the inventive concept provide a method of operating a data storage device including a nonvolatile memory storing a defense code for an error correction. The method includes; requesting a host for an asynchronous event based on a reliability index of the nonvolatile memory, receiving information associated with a host memory buffer following adjustment of the host memory buffer by the host (adjusted host memory buffer) based on the asynchronous event, and updating the defense code to the adjusted host memory buffer with reference to information about the host memory buffer.

Example embodiments of the inventive concept provide a method of operating a data storage device in a computer system, the data storage device including a controller and a plurality of NAND flash memories storing a mapping table associated with a flash translation layer for the plurality of NAND flash memories, and the computer system including a host, a host memory accessible by the host and the data storage device. The method includes; upon power-up of the data storage device, performing a boot operation during which the host allocates a host memory buffer having a first size in the host memory, and a first part of the mapping table is loaded from the plurality of NAND flash memories to the host memory buffer, after performing the boot operation, performing normal data input/output (I/O) operations with reference to the first part of the mapping table loaded to the host memory buffer, and using the controller to count a number of map misses occurring as a result of the normal I/O operations and generating a counting result, comparing the counting result in the controller with a map miss threshold, and upon determining that the counting result is greater than the map miss threshold, issuing an asynchronous event request from the controller to the host, and in response to the asynchronous event request, the host reallocates the host memory buffer to have a second size.

BRIEF DESCRIPTION OF THE DRAWINGS

FIG. 14 is a set of tables illustrating one possible specification of an asynchronous event, as contemplated by the embodiments illustrated in FIGS. 5 through 13.

FIG. 15 is a set of tables illustrating one possible specification of a threshold value, as contemplated by the embodiments illustrated in FIGS. 5 through 13.

DETAILED DESCRIPTION

Embodiments of the inventive concept will be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art.

Throughout the written description and drawings, like reference numbers and labels are used to denote like or similar elements, features, and/or method steps.

Figure 1:
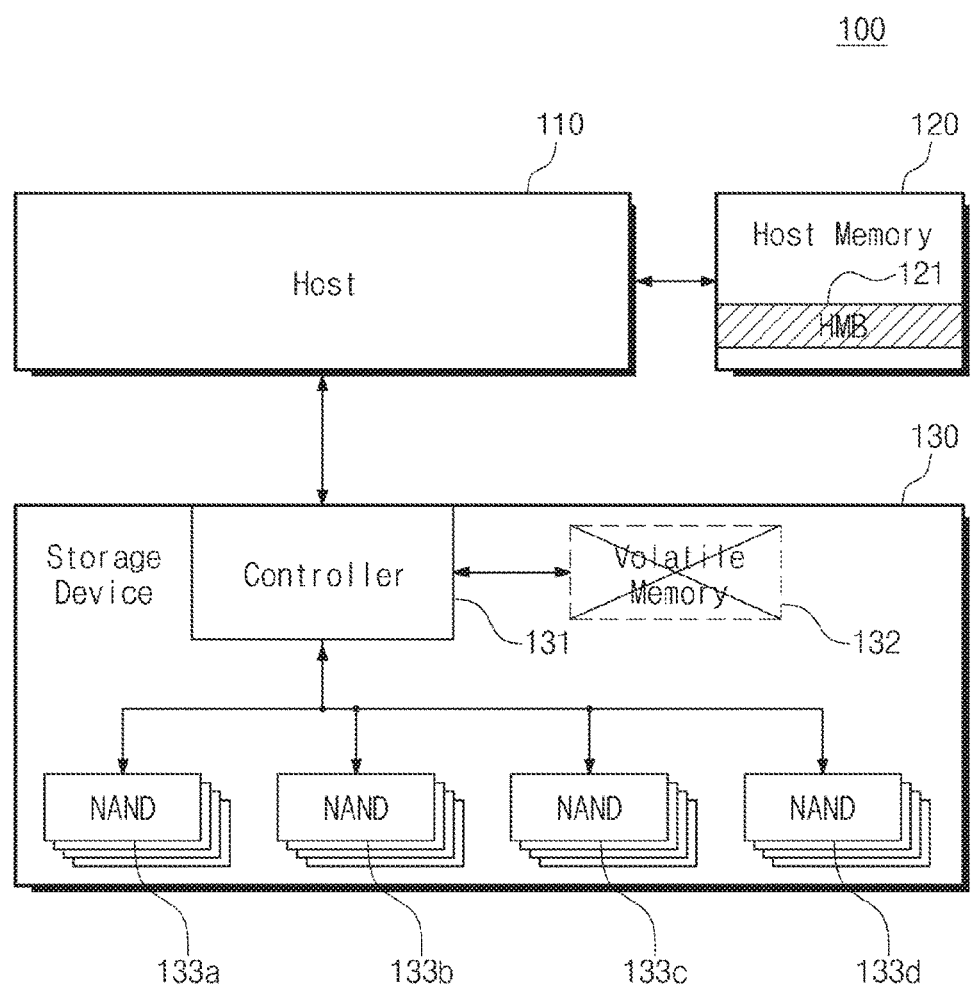
FIG. 1 is a block diagram illustrating a computer system including a data storage device configured to operate according to example embodiments of the inventive concept.

Figure (FIG. 1 is a block diagram illustrating a computer system including a data storage device configured to operate according to example embodiments of the inventive concept. Referring to FIG. 1, a computer system 100 may include a host 110, a host memory 120, and a data storage device 130.

The host 110 can drive constituent elements using, for example, an operating system (OS) included in the computer system 100. The host 110 may include controllers that control constituent elements included in the computer system 100, such as various interface(s), display(s) and related computational engine(s). The host 110 take many different forms, such as a central processing unit (CPU), a graphic processing unit (GPU), a system on chip (SoC), and an application processor (AP).

The host memory 120 may perform various data input/output (I/O) operation(s) under the control of the host 110. The host memory 120 may operate as a main memory, an operational memory, a buffer memory, and/or a cache memory. The host memory 120 may include volatile memory, such as a DRAM, a SRAM, etc. Referring to FIG. 1, the host memory 120 may include a host memory buffer (HBM) 121.

The data storage device 130 may perform various data I/O operation(s) in response to the host 110. Referring to FIG. 1, the data storage device 130 may include a controller 131 and a plurality of NAND flash memories (133a to 133d). However, the data storage device 130 need not include a volatile memory 132. Of course, the number, arrangement and type of nonvolatile memory (e.g., NOR flash memory, ferroelectric RAM (FRAM), phase-change RAM (PRAM), thyristor RAM (TRAM), magnetic RAM (MRAM), etc.) provided by the data storage device 130 may vary with design, but is assumed to be NAND flash memories (133a to 133d) in the illustrated example of FIG. 1.

The controller 131 may be used to control the execution of data I/O operations with respect to the NAND flash memories (133a to 133d) in response to host 110. To this end, the controller 131 may be used to convert logical address(es) received from the host 110 into corresponding physical address(es) with reference to a mapping table. Thereafter, the controller 131 may store data in the NAND flash memories (133a to 133d) or read data from the NAND flash memories (133a to 133d) with reference to the physical address(es).

An interface between the controller 131 and the host 110 may be configured to implement one or more data communication protocol(s) or specification(s). For example, the interface may support communication using at least one the conventionally understood standards associated with the Universal Serial Bus (USB), Advanced Technology Attachment (ATA), serial ATA (SATA), Small Computer Small Interface (SCSI), serial attached SCSI (SAS), parallel ATA (PATA), High Speed Inter-Chip (HSIC), Firewire, Peripheral Component Interconnection (PCI), PCI express (PCIe), Nonvolatile Memory Express (NVMe), Universal Flash Storage (UFS), Secure Digital (SD), Multi-Media Card (MMC), embedded MMC (eMMC), etc.

As previously noted, the data storage device 130 need not include the volatile memory 132. Instead, the data storage device 130 may use the host memory 120 connected to the host 110. To this end, the host 110 may allocate part of the host memory 120 to serve, for example, as a host memory buffer 121. Hence, the term "host memory buffer" 121 may denote some designated part (or collection of parts) the host memory 120, as operationally allocated by the host 110 in behalf of the data storage device 130.

For example, a mapping table may be stored in the NAND flash memories (133a to 133d) during a power-down (or shut down) routine executed by the computer system 100 or data storage device 130. When power is restored to the data storage device 130, the mapping table may be loaded to the host memory buffer 121. In various circumstances, the entire mapping table or just a portion of the mapping table may be loaded from the NAND flash memories (133a to 133d) to the host memory buffer 121, depending, for example, on the allocated data storage capacity of the host memory buffer 121 as defined by the host 110.

In a case where the entire mapping table is stored in the host memory buffer 121, the controller 131 may control the execution of a data I/O operations without a map miss in relation to the mapping table. Here, the term "map miss" denotes an event wherein the controller 131 fails to locate in the host memory buffer 121 a target portion of the mapping table corresponding to a particular logical address received from the host 110. Given this definition, it may be readily understood that a map miss will not occur, if the entire mapping table is stored in the host memory buffer 121. However, the possibility of map miss occurring exists if less than the entire mapping table is stored in the host memory buffer 121.

A user of the computer system 100 may arbitrarily access (first access) target data stored in the data storage device 130. Subsequently, the user may again (or repeatedly) access (second or subsequent access) the target data (i.e., the most recently accessed data). Alternately, the user may access data that is adjacent to the target data (adjacent data) during a second or subsequent access. These types of data access may be understood has having a regional characteristic (i.e., "data locality"). That is, subsequently accessed data will be proximate to or identical (wholly or in part) to data recently or most recently accessed. Recognizing this regional characteristic in certain types of data, and corresponding data access, the entire mapping table need not necessarily be stored in the host memory buffer 121. Instead, only a part of the mapping table identified or suggested by the regional characteristic may be stored in the host memory buffer 121.

Thus, under the foregoing circumstances as one example, part of the mapping table may be loaded from the NAND flash memories (133a to 133d) to be stored in the host memory buffer 121. More specifically, the controller 131 may store part of the mapping table in the host memory buffer 121 in consideration of data identified as frequently or recently accessed by the user (i.e., "hot data"). Using this approach, the data storage capacity of the host memory buffer 121 may be relatively decreased as compared with embodiments wherein the entire mapping table is stored in the host memory buffer 121.

However, the tradeoff for the decrease in host memory buffer 121 size is the possibility of a map miss occurring. Nonetheless, when a map miss occurs, the controller 131 can read from the copy of the entire mapping table stored in the NAND flash memories (133a to 133d) (e.g., a part of the mapping table corresponding to a logical target address received from the host 110). Thus, when a map miss occurs, the controller 131 has to read from the mapping table stored in the NAND flash memories (133a to 133d). However, the overall I/O speed of the controller 131 will be decreased when the controller 131 to forced to access the mapping table stored in the NAND flash memories (133a to 133d).

Figure 2:
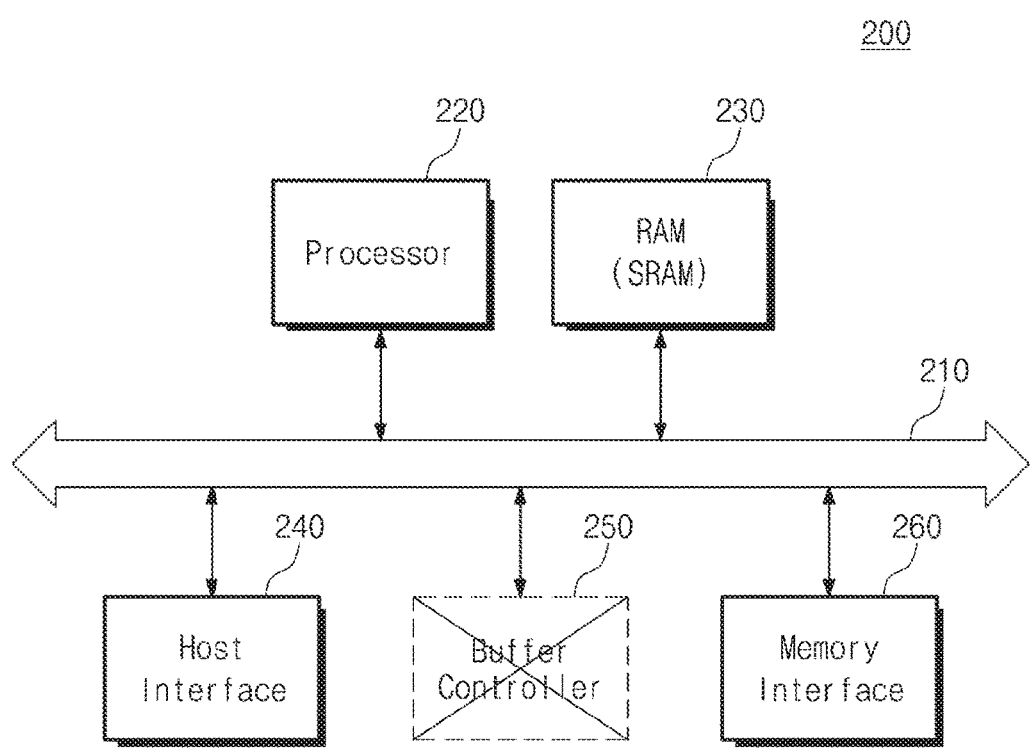
FIG. 2 is a block diagram further illustrating in one example (200) the controller 131 of FIG. 1.

FIG. 2 is a block diagram further illustrating a controller (200) in one possible example of the controller 131 of FIG. 1. Referring to FIGS. 1 and 2, the controller 200 may include a bus 210, a processor 220, a RAM 230, a host interface 240, and a memory interface 260. However, the controller 200 need not include a buffer controller 250.

The bus 210 is configured to provide a channel between constituent elements of the memory controller 200.

The processor 220 may control an overall operation of the memory controller 200 and perform a logical operation. The processor 220 may communicate with an external host through the host interface 240. The processor 220 may store a command or an address received through the host interface 240 in the RAM 230.

The RAM 230 may be used as an operation memory, a cache memory, or a buffer memory of the processor 220. The RAM 230 may store codes and commands executed by the processor 220. The RAM 230 may store data processed by the processor 220. The RAM 230 may include a SRAM.

The host interface 240 is configured to communicate with the host 110 under the control of the processor 220. The host interface 240 may be configured to perform a communication using at least one of the various protocols described above in relation to FIG. 1.

In certain embodiments, the buffer controller 250 may be included to control a buffer (e.g., DRAM) built in the data storage device. However, since a buffer is not included in the data storage device 130 and the controller 200 performs data I/O operation(s), the loading of a mapping table, etc., using the host memory buffer 121, the buffer controller 250 need not be included in the controller 200. Thus, the overall size and cost of the data storage device 130 may be decreased.

Referring still to FIGS. 1 and 2, the use of the volatile memory 132, when present, may be controlled by the processor 220. In the computer system 100 including a data storage device according to example embodiments of the inventive concept, the data storage device 130 need not include the volatile memory 132. Thus, the data storage device 130 may not include the buffer controller 250.

The memory interface 260 may communicate with the NAND flash memories (133a to 133d) (refer to FIG. 1) under the control of the processor 220.

Figure 3:
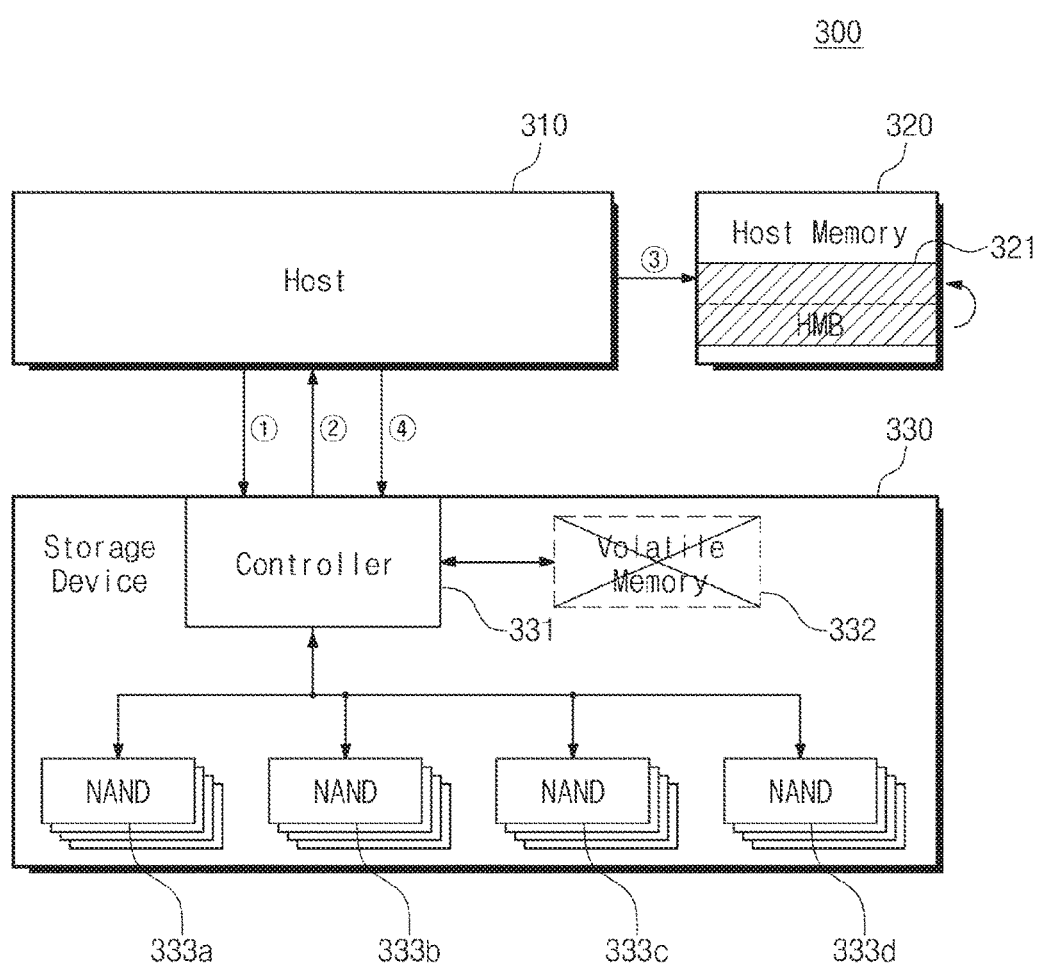
FIG. 3 is a block diagram illustrating a data storage device that may be configured to operate according to example embodiments of the inventive concept.

FIG. 3 is a block diagram illustrating a data storage device configured to operate according to example embodiments of the inventive concept. Referring to FIG. 3, a computer system 300 may include a host 310, a host memory 320, and a data storage device 330. Here, the illustrated embodiment of FIG. 3 assumes that the size of a host memory buffer 321 is sufficient to operate in the manner previously described.

Referring to FIGS. 1 and 3, the host 310 is assumed to transmit an asynchronous event command to the controller 331 (①). The aforementioned command may be stored in a so-called submission queue. Here, arbitrary commands communicated to the controller 331 by the host 310 may be sequentially stored in the submission queue. Thus, the submission queue may be understood as a buffer in which a command is stored until its execution.

The controller 331 may request use of various resources in the host in response to the asynchronous event, or in response to the asynchronous event command (②). The aforementioned request may be stored in a so-called completion queue. Here, results indicating a state of the data storage device 330 in response to various commands provided by the host 310 may be sequentially stored in the completion queue. Thus, the completion queue and the submission queue operate as a paired set of buffers.

The controller 331 determines whether the size of the host memory buffer 321 is sufficient, and may request the host 310 for the asynchronous event according to the determination. For example, in a case where a number of map misses increased, or in a case where a reliability index associated with the plurality of NAND flash memories (333a to 333d) is decreased, the controller 331 may request the host 310 to increase the allocated size of the host memory buffer 321.

The host 310 may adjust a size of the host memory buffer 321 with reference to the asynchronous event of the controller 331 (③). Referring to FIG. 3, the size of the host memory buffer 321 may be increased by the host 310. Although not illustrated, the size of the host memory buffer 321 may be decreased by the host 310.

The host 310 may transmit size information associated with the host memory buffer 321 to the data storage device 330 (④). More specifically, the host 310 may transmit size information for the host memory buffer 321 or information about whether the host memory buffer 321 is activated through a set feature command.

According to a method of operating the data storage device in accordance with example embodiments of the inventive concept, the allocated size of the host memory buffer 321 may be changed according to the state of the data storage device 330. Here, the "state" of the data storage device 330 may be indicated by a counted number of map misses, an increase in the counted number of map misses, a change in the reliability index for the NAND flash memories (333a to 333d), etc.

When the size of the host memory buffer 321 is increased, the controller 331 may newly update mapping data to the host memory buffer 321. In this case, the number of the map misses may be decreased.

The controller 331 may update a defense code to the host memory buffer 321. Here, the defense code may be a code for improving a reliability index of the NAND flash memories (333a to 333d). The defense code may be an error correction code (ECC) or a low density parity check code (LDPC), for example. In addition, besides the defense code, a software program for improving a reliability index of the NAND flash memories (333a to 333d) may be updated to the host memory buffer 321. A read retry program may be updated to the host memory buffer. In the case where the defense code is updated, the reliability index of the NAND flash memories (333a to 333d) may be improved.

Figure 4:
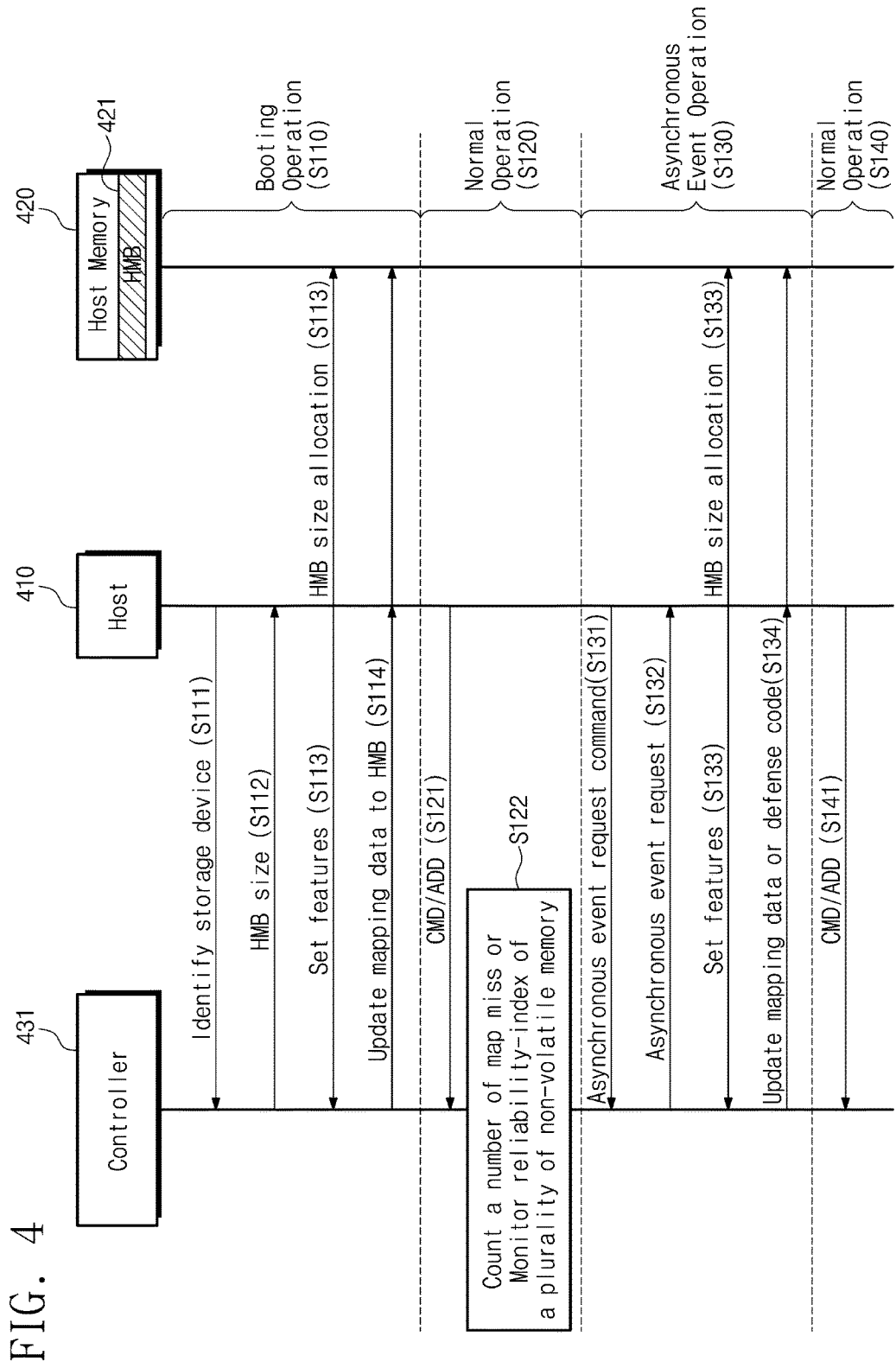
FIG. 4 is an operational diagram illustrating various operations between a host, a host memory, and a controller, such as the embodiment illustrated in FIG. 3.

FIG. 4 is an operational diagram illustrating operation between a host, a host memory, and a controller, such as those described in relation to FIG. 3.

An operation S110 represents a booting process of a computer system. Operations S111, S112, S113, and S114 may be performed during operation S110. In the operation S111, a host 410 may identify a controller 431. More specifically, the host 410 may transmit an identifier to the controller 431 to check whether the controller 431 can use a host memory buffer 421.

In the operation S112, the controller 431 may notify the host 410, via communication of corresponding host memory buffer size information, of whether the controller 431 uses the host memory buffer 421. In the case where the controller 431 uses the host memory buffer 421, the controller 431 may request the host 410 for a required size of the host memory buffer 421.

In the operation S113, the host 410 may allocate the host memory buffer 421 with reference to the request of the controller 431 in the operation S112. The host 410 may notify an allocation result to the controller 431 after allocating a size of the host memory buffer 421. The host 410 may notify the allocation result to the controller 431 through a set feature command. The set feature command may include size information of the host memory buffer 421 or information about whether the host memory buffer 421 is activated. As described above, only a part of the mapping table may be stored in the host memory buffer 421 considering, for example, a regional characteristic of the target data.

In the operation S114, the controller 431 may update a part of the mapping table to the host memory buffer 421. The controller 431 may update a part of the mapping table to the host memory buffer 421 through the host 410.

In an operation S120, the host 410, the host memory 420, and the controller 431 may perform a normal operation. The normal operation may mean an overall operation of the host 410, the host memory 420, and the controller 431 by a user. The operation S120 may include an operation S121 and an operation S122.

In the operation S121, the host 410 may transmit a command and an address to the controller 431. Although not illustrated, a data I/O may be performed between the host 410 and the host memory 420. To this end, the controller 431 may refer to the mapping table stored in the host memory buffer 421.

In the operation S122, the controller 431 may count the number of map misses according to a method of operating consistent with an embodiment of the inventive concept. As time passes and regardless of the number of map misses, a reliability index of the NAND flash memories (333a to 333d) (refer to FIG. 3) may be decreased due to a limit of the number of write operations directed to the nonvolatile (flash) memory cells. Thus, the controller 431 may monitor the reliability index of the NAND flash memories (333a to 333d) according to an operation method consistent with embodiments of the inventive concept.

In an operation S130, the host 410 and the controller 431 may perform an asynchronous event operation with respect to an asynchronous event. The operation S130 may include operations S131, S132, S133 and S134.

In the operation S131, the host 410 may issue (or transmit) a command for the asynchronous event to the controller 431.

In the operation S132, the controller 431 may request the host 410 for the asynchronous event in response to the command of the operation S131. The controller 431 may decrease the number of the map misses or improve the reliability index of the NAND flash memories (333a to 333d) through the asynchronous event. More specifically, the controller 431 may transmit a request for a size adjustment of the host memory buffer 421 through the asynchronous event.

In the operation S133, the host 410 may adjust or reallocate the size of the host memory buffer 421 in response to the asynchronous event. Through the size adjustment, a size of the host memory buffer 421 may increase or decrease. In the case where the number of the map misses increases, a size of the host memory buffer 421 may increase. In the case where the number of the map misses decreases, a size of the host memory buffer 421 may decrease.

In the case where the reliability index of the NAND flash memories (333a to 333d) is decreased, a size of the host memory buffer 421 may increase. After adjusting a size of the host memory buffer 421, the host 410 may notify the controller 431 of an adjustment result. To notify the controller 431 of the adjustment result, the host 410 may transmit a set feature command to the controller 431. As described above, the set feature command may include size information of the host memory buffer 421 or information about whether the host memory buffer 421 is activated.

In the operation S134, the controller 431 may update a mapping table or a defense code to the host memory buffer 421. More specifically, the controller 431 may update the mapping table or the defense code to the host memory buffer 421 through the host 410.

In an operation S140, after the asynchronous event requested by the controller 431 is processed, the host 410, the host memory 420, and the controller 431 may perform a normal operation again. That is, the operation S140 is similar to the operation S120.

In the operation S140, a size of the host memory buffer 421 is adjusted by the asynchronous event of the controller 431 considering the regional characteristic of data. Thus, the number of map misses in the operation S140 may be decreased as compared with that in the operation S120. In addition, a size of the host memory buffer 421 is increased by the asynchronous event of the controller 431 considering the reliability index of the NAND flash memories (333a to 333d). Thus, an error rate of data in the operation S140 may be greatly decreased as compared with that in the operation S120.

Although not illustrated in FIG. 4, the controller 431 may further generate the asynchronous event. More specifically, even after the operation S141, the asynchronous event may be additionally generated considering the regional characteristic of data or the reliability index.

Figure 5:
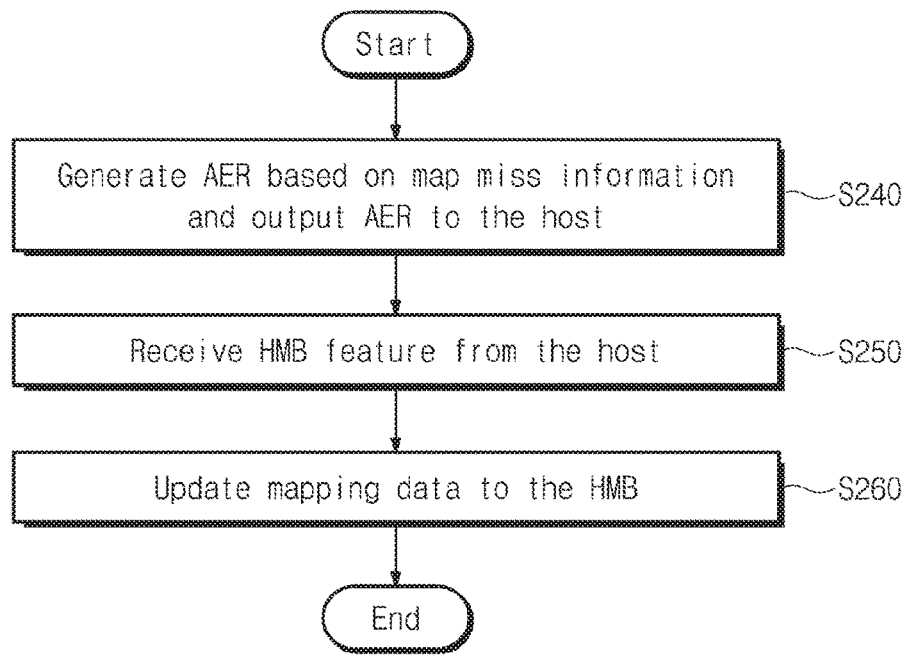
FIG. 5 is a flowchart illustrating a method of operating a data storage device according to example embodiments of the inventive concept.

FIG. 5 is a flowchart illustrating a method of operating a data storage device according to example embodiments of the inventive concept. FIG. 5 will be described with reference to FIG. 3.

In an operation S240, the controller 331 may generate an asynchronous event request based on map miss information. The map miss information may mean information about a map miss that occurs when the controller 331 performs a command of the host 310. The generated asynchronous event may be output to the host 310.

In an operation S250, the controller 331 may receive information (HMB feature) about the host memory buffer 321 adjusted by the host 310 according to the asynchronous event.

In an operation S260, the controller 331 may update a defense code to the host memory buffer 321 with reference to the information (HWB feature) about the host memory buffer 321.

Figure 6:
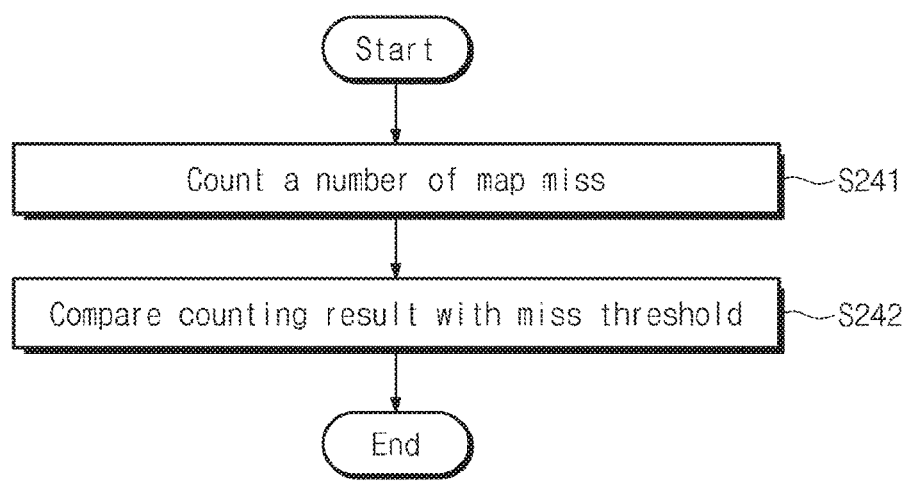
FIG. 6 is a flowchart further illustrating in one example the step S240 of FIG. 5.

FIG. 6 is a flowchart further illustrating one possible example of the step S240 of FIG. 5. FIG. 6 will be described with reference to FIGS. 3, 4 and 5.

In an operation S241, the controller 331 may count the number of map misses. As described above, the map miss may occur only when a part of a mapping table is stored in the host memory buffer 321. The operation S241 may correspond to the operation S122 of FIG. 4.

In an operation S242, the controller 331 may compare a counting result with a miss threshold value. The controller 331 may determine whether to request an asynchronous event based on a comparison result.

Figure 7:
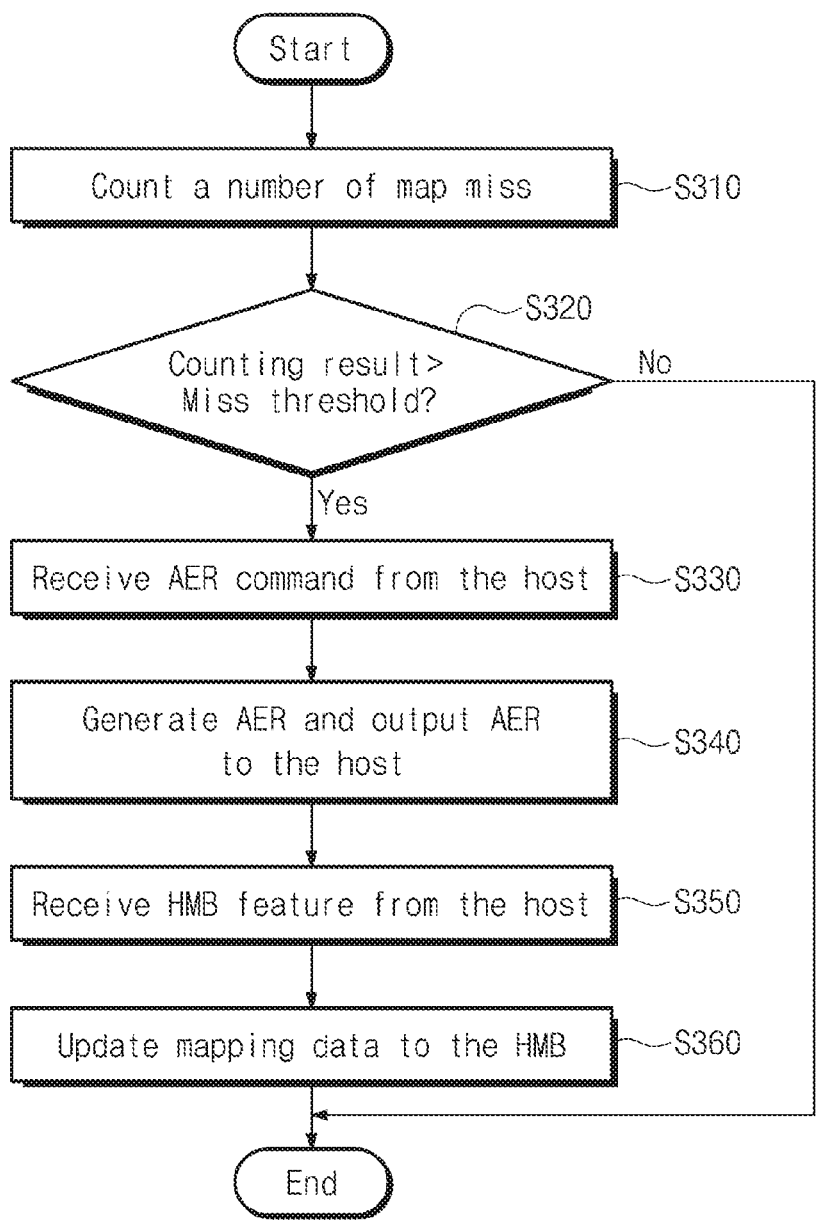
FIGS. 7 and 8 are respective flowcharts further illustrating method(s) of operating the data storage device of FIG. 5.

FIG. 7 is a flowchart illustrating a method of operating a data storage device, such as the data storage device of FIG. 3. FIG. 7 will be described with reference to FIGS. 3, 4 and 5.

In an operation S310, the controller 331 may count the number of map misses. As described above, the map miss may occur only when a part of a mapping table is stored in the host memory buffer 321. The operation S310 may correspond to the operation S122 of FIG. 4 and the operation S241 of FIG. 6.

In an operation S320, the controller 331 may compare a counting result with a miss threshold value. In the case where the counting result is greater than the miss threshold value (S320=Yes), an operation S330 may be performed.

In the operation S330, the controller 331 may receive an asynchronous event command from the host 310. The operation S330 may correspond to the operation S131 of FIG. 4 and the operation S240 of FIG. 5.

In an operation S340, the controller 331 may generate an asynchronous event request (AER) in response to the asynchronous event command. The controller 331 may output an asynchronous event to the host 310. In the case where the counting result is greater than the miss threshold value, the asynchronous event may be generated by the controller 331. The operation S340 may correspond to the operation S132 of FIG. 4 and the operation S240 of FIG. 5.

In an operation S350, the controller 331 may receive a result (HMB feature) obtained by increasing, in response to the host 310, a size of the host memory buffer 321 according to the asynchronous event. The controller 331 may receive the result (HMB feature) from the host 310 through a set feature command. In response to the asynchronous event, the host 310 may increase a size of the host memory buffer 321. The operation S350 may correspond to the operation S133 of FIG. 4 and the operation S250 of FIG. 5. The increment (HMB feature) of a size of the host memory buffer 321 may be decided by the controller 331. The increment (HMB feature) of a size of the host memory buffer 321 may also be a predetermined value.

In the operation S360, the controller 331 may update a new part of a mapping table to the host memory buffer 321. Referring to FIG. 7, since the counting result is greater than the miss threshold value, a new mapping table having a size greater than that of the mapping table (refer to FIG. 4, S114) stored in the host memory buffer 321 before may be stored in the host memory buffer 321. The mapping table may be updated to the host memory buffer 321 in consideration of a size of the host memory buffer 321. The operation S360 may correspond to the operation S134 of FIG. 4 and the operation S260 of FIG. 5.

According to a method of operating a data storage device in accordance with example embodiments of the inventive concept, an asynchronous event may be generated considering the number of map misses. A new (or different) part of a mapping table may be updated to the host memory buffer 321 according to the asynchronous event. A mapping table may be stored in the host memory buffer 321 considering a regional characteristic of data. The method of operating a data storage device in accordance with example embodiments of the inventive concept may improve the time taken to access the NAND flash memories (333a to 333d) and then read a mapping table whenever a map miss occurs.

In addition, when a map miss occurs, a new mapping table may be updated to the host memory buffer 321. In this case, a previous mapping table may be backed up to the NAND flash memories (333a to 333d). In the case where a map miss frequently occurs, the number of accesses to NAND flash memories (333a to 333d) may increase. Thus, because of a back-up of the previous mapping table, a reliability index of the NAND flash memories (333a to 333d) may be decreased. The method of operating a data storage device in accordance with example embodiments of the inventive concept may prevent a decrease in the reliability index due to the back-up of the previous mapping table.

Although not illustrated, the miss threshold value in the method of operating a data storage device in accordance with example embodiments of the inventive concept may be set to one of a plurality of levels. In FIG. 7, only a case wherein a size of the host memory buffer 321 increases is illustrated, but the inventive concept is not limited thereto. For example, in the case where the number of map misses is decreased after a size of the host memory buffer 321 increases, a size of the host memory buffer 321 may be decreased to the initially set size by the method of operating a data storage device in accordance with example embodiments of the inventive concept.

FIG. 7 relates to a case where a size of the host memory buffer 321 increases when the number of map misses increases in a state where a size of the host memory buffer 321 is initially set to be small.

Figure 8:
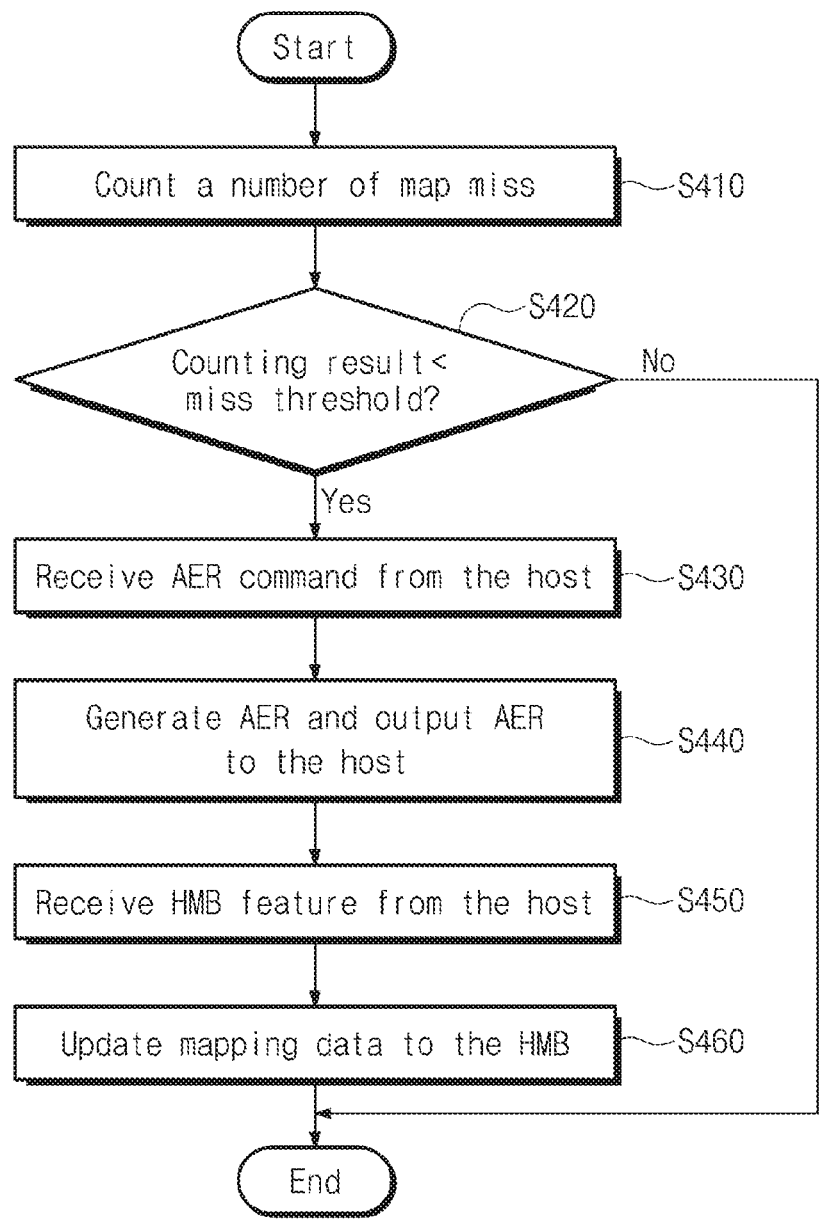

FIG. 8 is another flowchart illustrating a method of operating a data storage device, such as the data storage device of FIG. 3. FIG. 8 will be described with reference to FIGS. 3, 4, 5, 6 and 7.

In an operation S410, the controller 331 may count the number of map misses. The operation S410 may correspond to the operation S122 of FIG. 4 and the operation S241 of FIG. 6.

In an operation S420, the controller 331 may compare a counting result with a miss threshold value. Here, the miss threshold value may be the same as or different from the miss threshold value described in the operation S320 of FIG. 7. In the case where the counting result is less than the miss threshold value (S420=Yes), an operation S430 may be performed.

In the operation S430, the controller 331 may receive an asynchronous event command from the host 310. The operation S430 may correspond to the operation S131 of FIG. 4.

In an operation S440, the controller 331 may generate an asynchronous event request. The controller 331 may output an asynchronous event to the host 310. In the case where the counting result is less than the miss threshold value, the asynchronous event may be generated by the controller 331. The operation S440 may correspond to the operation S132 of FIG. 4 and the operation S240 of FIG. 5.

In an operation S450, the controller 331 may receive a result (HMB feature) obtained by withdrawing, by the host 310, the host memory buffer 321 according to the asynchronous event. In response to the asynchronous event, the host 310 may decrease a size of the host memory buffer 321. The operation S450 may correspond to the operation S133 of FIG. 4. The decrement of a size of the host memory buffer 321 may be determined by the controller 331. The decrement of a size of the host memory buffer 321 may be a predetermined value.

In an operation S460, the controller 331 may update a new part of a mapping table to the host memory buffer 321. Referring to FIG. 8, since the counting result is less than the miss threshold value, a new mapping table having a size less than the mapping table (refer to FIG. 4, S114) stored in the host memory buffer 321 before may be stored in the host memory buffer 321. The mapping table may be updated to the host memory buffer 321 in consideration of a size of the host memory buffer 321. The operation S460 may correspond to the operation S134 of FIG. 4.

In FIG. 8, although only a case where a size of the host memory buffer 321 is decreased is illustrated, the inventive concept is not limited thereto. In the case where the number of map misses increases after a size of the host memory buffer 321 is decreased, a size of the host memory buffer 321 may increase by the method of operating the data storage device in accordance with example embodiments of the inventive concept.

Figure 9:
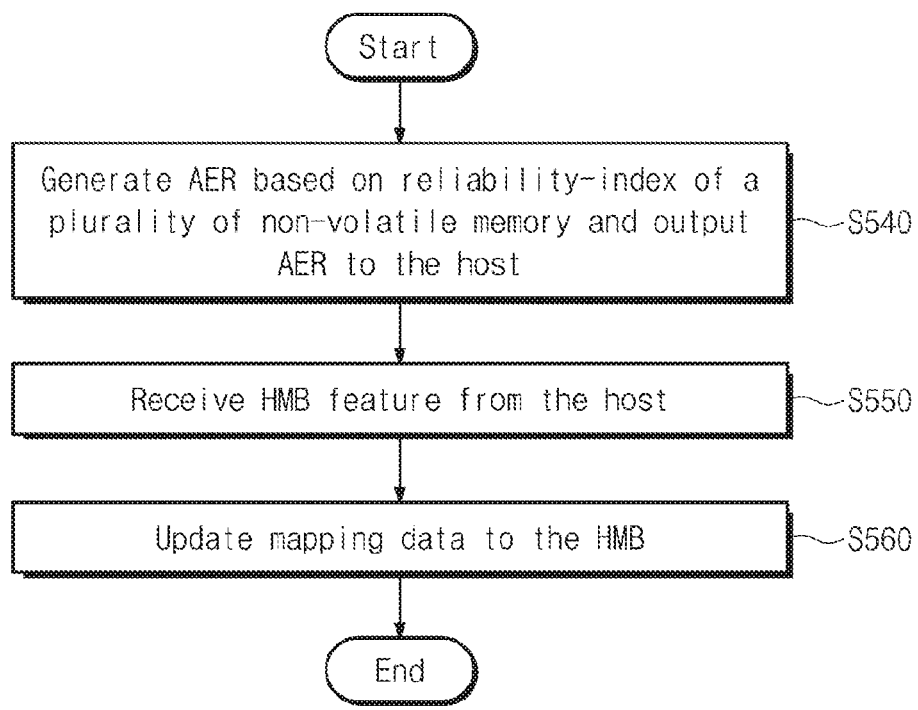
FIG. 9 is a flowchart illustrating a method of operating a data storage device according to example embodiments of the inventive concept.

FIG. 9 is a flowchart illustrating a method of operating a data storage device according to example embodiments of the inventive concept. FIG. 9 will be described with reference to FIGS. 3 and 4.

In an operation S540, the controller 331 may generate an asynchronous event request based on a reliability index of the NAND flash memories (333a to 333d). The generated asynchronous event request may be output to the host 310.

In an operation S550, the controller 331 may receive information (HMB feature) about the host memory buffer 321 adjusted by the host 310 according to an asynchronous event.

In an operation S560, the controller 331 may update a defense code to the host memory buffer 321 with reference to the information (HMB feature) about the host memory buffer 321.

Figure 10:
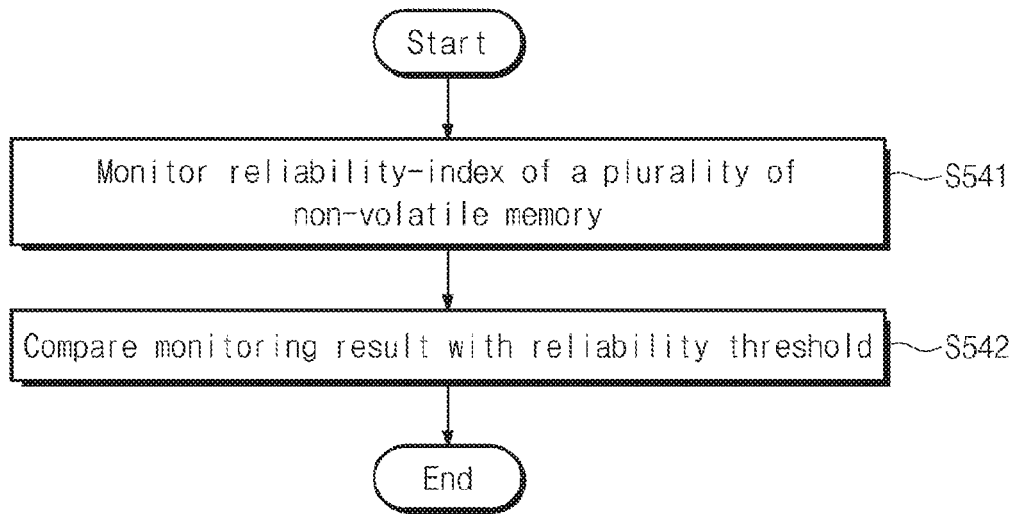
FIG. 10 is a flowchart further illustrating in one example the step S540 of FIG. 9.

FIG. 10 is a flowchart further illustrating in one possible example the step S540 of FIG. 9. FIG. 10 will be described with reference to FIGS. 3, 4 and 9.

In an operation S541, the controller 331 may monitor a reliability index of the NAND flash memories (333a to 333d). To check the reliability index, the controller 331 may check a bit error rate (BER). In the case where the reliability index is high, the BER may be relatively low. In the case where the reliability index is low, the BER may be relatively high. However, a method of checking the reliability index is not limited thereto. The operation S541 may correspond to the operation S122 of FIG. 4.

In an operation S542, the controller 331 may compare a motoring result with a reliability threshold value. The controller 331 may determine whether to request an asynchronous event based on a comparison result.

Figure 11:
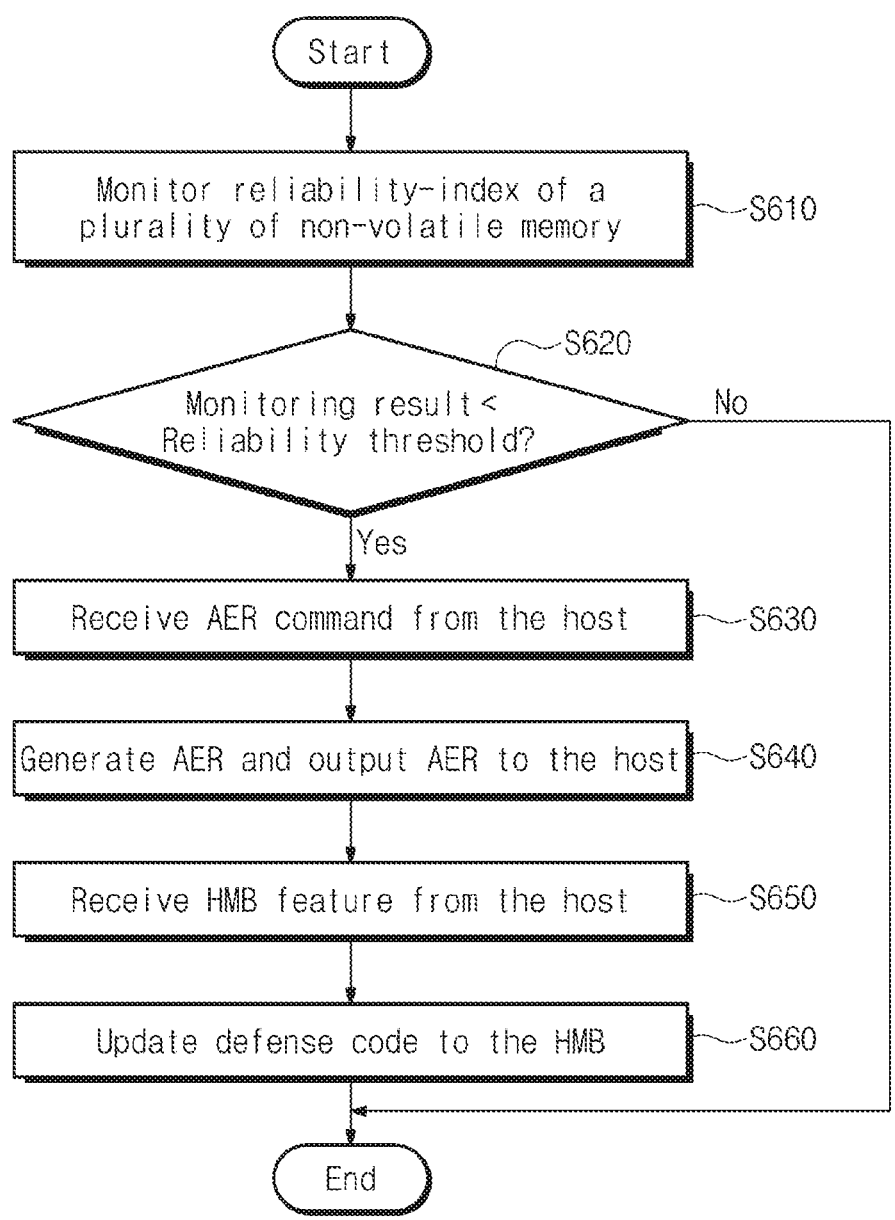
FIG. 11 is a flowchart illustrating a method of operating a data storage device, such as the embodiment illustrated in FIG. 9.

FIG. 11 is a flowchart illustrating a method of operating a data storage device, similar to the method described in relation to FIG. 9. FIG. 11 will be described with reference to FIGS. 3, 4, 9 and 10.

In an operation S610, the controller 331 may monitor a reliability index of the NAND flash memories (333a to 333d). The operation S610 may correspond to the operation S122 of FIG. 4 and the operation S541 of FIG. 9.

In an operation S620, the controller 331 may compare a monitoring result with a reliability threshold value. In the case where the monitoring result is less than the reliability threshold value (S620=Yes), an operation S630 may be performed. In the case where the monitoring result is greater than the reliability threshold value (S620=No), the process ends.

In an operation S630, the controller 331 may receive an asynchronous event command from the host 310. The operation S630 may correspond to the operation S131 of FIG. 4.

In an operation S640, the controller 331 may generate an asynchronous event request (AER). The controller 331 may output an asynchronous event to the host 310. In the case where the monitoring result is less than the miss threshold value, the asynchronous event may be generated by the controller 331. The operation S640 may correspond to the operation S132 of FIG. 4 and the operation S540 of FIG. 9.

In an operation S650, the controller 331 may receive a result (HMB feature) obtained by increasing, by the host 310, a size of the host memory buffer 321 according to the asynchronous event. In response to the asynchronous event, the host 310 may increase a size of the host memory buffer 321. The operation S650 may correspond to the operation S133 of FIG. 4 and the operation S550 of FIG. 9.

In an operation S660, the controller 331 may update a defense code to the host memory buffer 321. Since the defense code is newly updated to the host memory buffer 321, a size of the host memory buffer 321 may increase. The defense code may be updated to the host memory buffer 321 with reference to the size of the host memory buffer 321. The operation S660 may correspond to the operation S134 of FIG. 4 and the operation S560 of FIG. 9.

Figure 12:
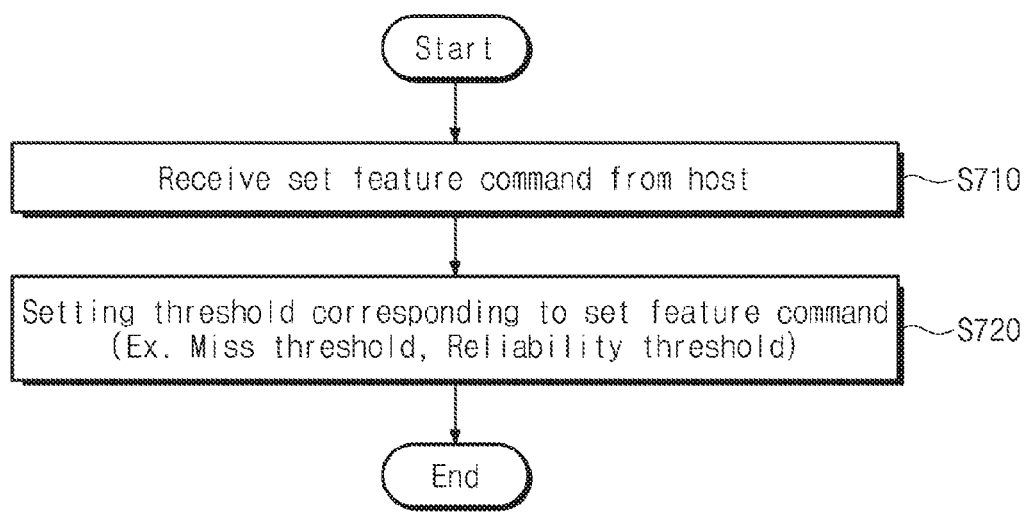
FIGS. 12 and 13 are respective flowcharts illustrating method(s) of operating a data storage device according to example embodiments of the inventive concept.

FIG. 12 is a flowchart illustrating a method of operating a data storage device according to example embodiments of the inventive concept. FIG. 12 will be described with reference to FIG. 3.

In an operation S710, the controller 331 may receive a set feature command from the host 310. In an operation S720, the controller 331 may set a threshold value in response to the set feature command. Here, the threshold value may be the miss threshold value or the reliability threshold value described above. The threshold value may be determined to a specific value by a manufacturer of the data storage device 330. An operation method of the data storage device described in FIG. 12 may be performed independently of the operation method described in FIGS. 5 through 11.

Figure 13:
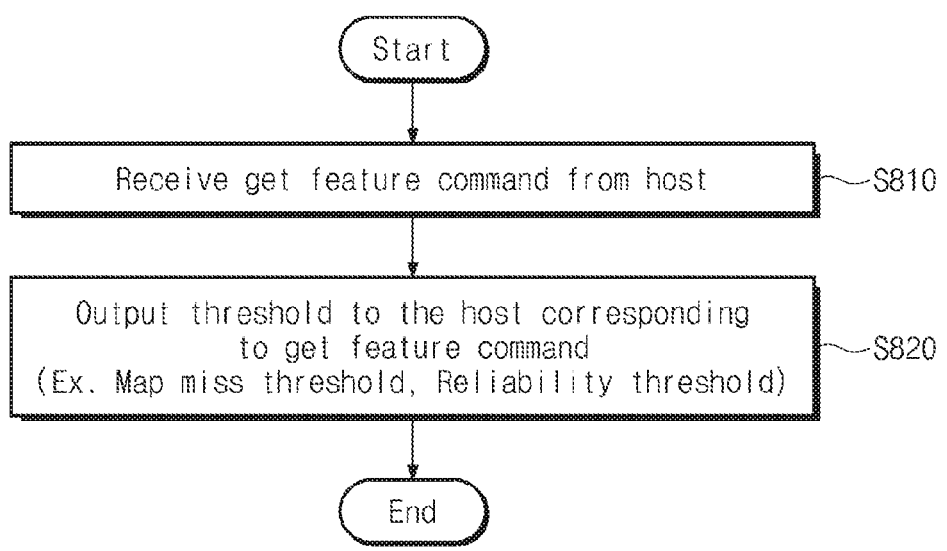

FIG. 13 is a flowchart illustrating a method of operating a data storage device according to example embodiments of the inventive concept. FIG. 13 will be described with reference to FIG. 3.

In an operation S810, the controller 331 may receive a get feature command from the host 310. In an operation S820, the controller 331 may output a threshold value to the host 310 in response to the get feature command. Similarly, the threshold value may be the aforementioned threshold value or the aforementioned reliability threshold value. A method of operating the data storage device described in FIG. 13 may be performed independently of the method of operating the data storage device described in FIGS. 5 through 12.

FIG. 14 is a set of tables illustrating one possible specification for an asynchronous event described above in relation to FIGS. 5 through 13. FIG. 14 will be described with reference to FIG. 3.

Information about the type of asynchronous event may be included in arbitrary bits in a completion queue (CQ). Referring to FIG. 14, information about the asynchronous event may be included in 0 through 2 bits in the completion queue. The host 310 may provide arbitrary commands to the controller 331. The arbitrary commands described above may be sequentially stored in a submission queue (SQ). After that, the stored arbitrary commands may be sequentially provided to the controller 331. Results processed by the controller 331 in response to the arbitrary commands may be sequentially stored in the completion queue.

Referring to FIG. 14, in the case where a value of the completion queue is 3h, the asynchronous event may include information that the number of map misses is greater than a miss threshold value in the controller 331. In the case where a value of the completion queue is 4h, the asynchronous event may include information that a defense code is needed to improve a reliability index with respect to a plurality of NAND flash memories. Here, a value of the completion queue corresponding to information about the asynchronous event is not limited to that described in FIG. 14.

FIG. 15 is a set of tables illustrating one possible specification for the threshold value described in relation to FIGS. 5 through 13. FIG. 15 will be described with respect to FIGS. 3, 4 and 12.

Referring to FIG. 15, in the case where a feature identifier is OEh, set feature information may include information about a threshold value. This information may be used in the operation of FIG. 4 and the operation S710 of FIG. 12. However, a value of the feature identifier is not limited to that illustrated in FIG. 15. In addition, the threshold value may be the aforementioned miss threshold value or the aforementioned reliability threshold value.

More specifically, information that the type of threshold values is distinguished may be included in 20 through 21 bits in the set feature information. Information that a threshold value is set may be included in 16 through 19 bits in the set feature information. A threshold value may be modified by the set feature command. A threshold value may return to the host 310 by a get feature command. Specific figures of a threshold value may be included in 0 through 15 bits in the set feature information. Specific figures of the threshold value may be determined by the host 310. A threshold value may be previously determined by a vendor of a data storage device when products are produced.

A method of operating a data storage device according to example embodiments of the inventive concept can substantially decrease the number of map misses or improve reliability of a nonvolatile memory.

The contents described above are specific examples for implementing the inventive concept. The inventive concept may include not only the embodiments described above but also embodiments in which a design is simply or easily capable of being changed. The inventive concept may also include technologies easily changed to be implemented using the aforementioned embodiments.

What is claimed is:

1. A method of operating a data storage device in which a nonvolatile memory is included and a mapping table defining a mapping relation between a physical address and a logical address of the nonvolatile memory is stored in a host memory buffer of a host memory accessible by a host, the method comprising:
   requesting a host for an asynchronous event based on information about a map miss that the mapping relation about the logical address received from the host is not included in the mapping table,
   wherein the host memory buffer is adjusted by the host based on the asynchronous event;
   receiving information about the host memory buffer adjusted by the host based on the asynchronous event; and
   updating the mapping table to the adjusted host memory buffer with reference to the information about the host memory buffer,
   wherein the requesting the host for the asynchronous event comprises
   counting a number of map misses that the mapping relation about the logical address received from the host is not included in the mapping table, and
   comparing a counting result with a miss threshold value.

2. The method of claim 1, wherein the data storage device does not include a volatile memory storing the mapping table.

3. The method of claim 1, wherein when the counting result is greater than the miss threshold value, a size of the host memory buffer is increased by the host.

4. The method of claim 3, wherein the mapping table is updated to the host memory buffer with reference to the size of the host memory buffer increased by the host.

5. The method of claim 1, wherein when the counting result is less than the miss threshold value, a size of the host memory buffer is decreased by the host.

6. The method of claim 5, wherein the mapping table is updated to the host memory buffer with reference to the size of the host memory buffer decreased by the host.

7. The method of claim 1, further comprising setting the miss threshold value in response to a request by the host.

8. The method of claim 7, further comprising outputting the set miss threshold value to the host in response to a command received from the host.

9. A method of operating a data storage device in a computer system, the data storage device including a controller and a plurality of NAND flash memories storing a mapping table associated with a flash translation layer for the plurality of NAND flash memories, and the computer system including a host, a host memory accessible by the host and the data storage device, the method comprising:
   upon power-up of the data storage device, performing a boot operation during which the host allocates a host memory buffer having a first size in the host memory, and a first part of the mapping table is loaded from the plurality of NAND flash memories to the host memory buffer;
   after performing the boot operation, performing normal data input/output (I/O) operations with reference to the first part of the mapping table loaded to the host memory buffer, and using the controller to count a number of map misses occurring as a result of the normal data I/O operations and generating a counting result;
   comparing the counting result in the controller with a map miss threshold, and upon determining that the counting result is greater than the map miss threshold, issuing an asynchronous event request from the controller to the host; and
   in response to the asynchronous event request, the host reallocates the host memory buffer to have a second size.

10. The method of claim 9, wherein the boot operation comprises:
    identifying the data storage device by the host; and
    after being identified by the host, the data storage device communicates first size information to the host,
    wherein the host allocates the host memory buffer having the first size in the host memory in response to the first size information.

11. The method of claim 10, wherein the identifying of the data storage device by the host comprises transmitting an identifier from the controller to the host.

12. The method of claim 9, further comprising:
    loading a second part of the mapping table to the host memory buffer after reallocating the host memory buffer to have the second size.

13. The method of claim 9, further comprising:
    after the reallocating the host memory buffer to have the second size, performing normal data I/O operations with reference to a second part of the mapping table, and using the controller to count a number of map misses occurring as a result of the normal data I/O operations performed after the reallocating the host memory buffer to have the second size and generating another counting result.

14. The method of claim 9, wherein when the counting result is greater than the map miss threshold, the first size of the host memory buffer is increased to the second size.

15. The method of claim 14, wherein the mapping table is updated to the host memory buffer with reference to the second size.

16. The method of claim 9, wherein when the counting result is less than the map miss threshold, the first size of the host memory buffer is decreased to the second size.

17. The method of claim 16, wherein the mapping table is updated to the host memory buffer with reference to the second size.

18. The method of claim 9, further comprising setting the map miss threshold in response to a request by the host.

19. The method of claim 18, further comprising outputting the set map miss threshold to the host in response to a command received from the host.

* * * * *